United States Patent
Holloway et al.

(10) Patent No.: US 6,461,877 B1
(45) Date of Patent: Oct. 8, 2002

(54) VARIABLE DATA COMPENSATION FOR VIAS OR CONTACTS

(75) Inventors: Karen L. Holloway, Poughkeepsie, NY (US); Kurt A. Tallman, Essex Junction, VT (US); Robert C. Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 09/608,534

(22) Filed: Jun. 30, 2000

(51) Int. Cl.[7] ............................................... H01L 21/66
(52) U.S. Cl. ............................................... 438/8; 438/9
(58) Field of Search .................... 438/7, 8, 9, FOR 141

(56) References Cited

U.S. PATENT DOCUMENTS

| | | | |
|---|---|---|---|
| 4,457,820 A | * | 7/1984 | Bergeron et al. |
| 5,614,765 A | | 3/1997 | Avanzino et al. ............ 257/774 |
| 5,691,238 A | | 11/1997 | Avanzino et al. ............ 437/195 |
| 5,795,823 A | | 8/1998 | Avanzino et al. ............ 438/639 |
| 5,807,761 A | * | 9/1998 | Coronel et al. |
| 5,874,201 A | | 2/1999 | Licata et al. ................. 430/314 |
| 5,933,761 A | | 8/1999 | Lee ............................. 438/783 |
| 5,990,015 A | | 11/1999 | Lin et al. ..................... 438/706 |
| 6,001,733 A | | 12/1999 | Huang et al. ................ 438/633 |
| 6,174,739 B1 | * | 1/2001 | Steffan |

* cited by examiner

*Primary Examiner*—George Fourson
*Assistant Examiner*—Joannie Adelle Garcia
(74) *Attorney, Agent, or Firm*—Ira Blecker; Cantor Colburn LLP (57) ABSTRACT

Described herein is a method for selectively enlarging vias connecting two different layers of conductors in a semiconductor device. Whether or not an individual via is extended on each of its edges is determined by the distance of the edge to the neighboring features. Since many vias can be selectively enlarged along one or more edges without infringing upon neighboring structures, via integrity and conductive characteristics are improved.

11 Claims, 9 Drawing Sheets

VARIABLE DATA COMPENSATION FOR VIAS OR CONTACTS

BACKGROUND OF THE INVENTION

The present invention relates generally to interconnection of conducting layers on a semiconductor device, and specifically to a method for selectively enlarging vias or contacts in dual damascene devices.

Semiconductor devices having two layers of metalization conventionally use metal-filled vias to electrically connect the layers at the appropriate points in the circuit. One conventional process, which is known as trench-first dual damascene via formation, involves forming the vias and the top metalization layer simultaneously.

In fabricating very large and ultra large scale integration circuits with the dual damascene process, an insulating or dielectric material, such as silicon oxide, of a semiconductor device is patterned with several thousand openings for the conductive lines and vias which are filled at the same time with metal, such as aluminum, and serve to interconnect the active and/or passive elements of the integrated circuit. The dual damascene process also is used for forming the multi-level conductive lines of metal, such as copper, in the insulating layers, such as polyimide, of multi-layer substrate on which semiconductor devices are mounted.

There are several problems involved in fabrication of vias in trench first dual damascene technology, however. In regard to metalization issues, the conductor fill process is facilitated by expanded via size. Statistical failures are made less probable by enlarging vias or contacts; thus, yields are increased. The lithography process for vias in a trench-first dual damascene integration scheme also is very difficult and the process latitude is very narrow. This limitation in process latitude is a result of two factors—the severe topography of the trench-first damascene integration scheme creates via lithography problems, and the small (on the order of 0.25 micron) feature size necessary for the current technology. The vias need to be imaged in resist sitting in lines and pads of widely varying widths and pattern factors. For narrow lines, the local resist thickness at each via feature depends on the local pattern density of the trenches. For wide lines, because the resist relaxes into the already-etched pad or wide line, the resist surface drops down. The focus latitude, especially, can be too small to manufacture all types of via features consistently. Inconsistent via formation can lead to short circuits or undependable circuits.

What is needed in the art is method for forming vias that allows for greater quality and consistency.

BRIEF SUMMARY OF THE INVENTION

The above-described and other disadvantages of the prior art are overcome or alleviated by the method of the present invention, which comprises selectively enlarging vias to expand the dimensions of those vias which are capable of expansion. The method for selective enlargement comprises: a) determining if a first side of a first via can be extended by comparison of expanded via edge position to applicable via-line and/or via-via minimum distance lay-out ground rules, b) extending said first side if it was determined said first side could be extended, and c) repeating steps a) and b) for the remaining sides of said first via.

The above-described and other features and advantages of the present invention will be appreciated and understood by those skilled in the art from the following detailed description, drawings, and appended claims.

BRIEF DESCRIPTION OF THE DRAWINGS

The device and method of the present invention will now be described by way of example only, with reference to the accompanying drawings, which are meant to be exemplary, not limiting, and wherein like elements are numbered alike in several FIGURES, in which:

FIG. 1b is cross section A—A' of FIG. 1a;

FIG. 2b is cross section A—A' of FIG. 2a;

FIG. 3b is cross section A—A' of FIG. 3a;

DETAILED DESCRIPTION OF THE INVENTION

Described herein is a method for increasing via size in as many directions as possible in order to improve the quality of the vias. Vias are extended in any or all of four directions to maximize via size without causing shorts in the interconnections.

FIGS. 1a through 3c illustrate one embodiment of the manner in which the vias of the present invention are formed. One skilled in the art, however, will realize that other via fabrication techniques are available, and are within the scope of the method described herein.

Figure 1A:
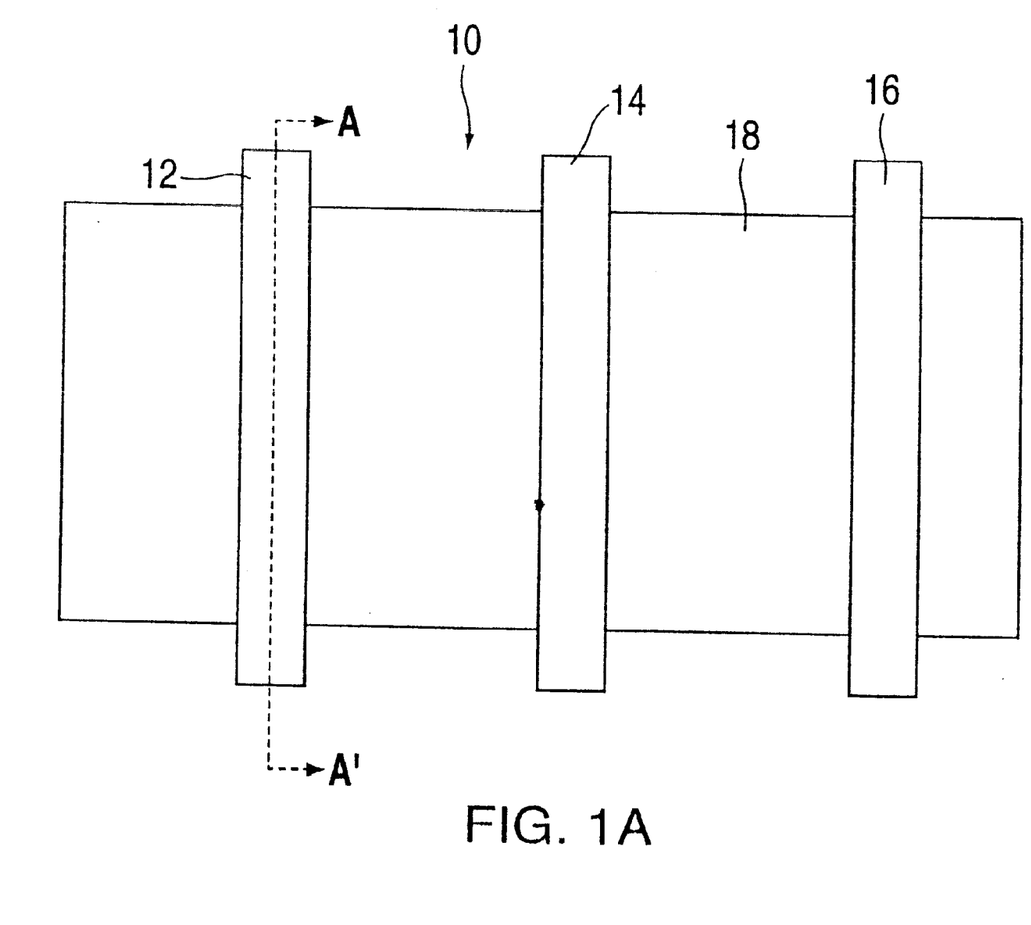
FIG. 1a is a layout view of a semiconductor substrate with three interconnection lines.
Figure 1B:
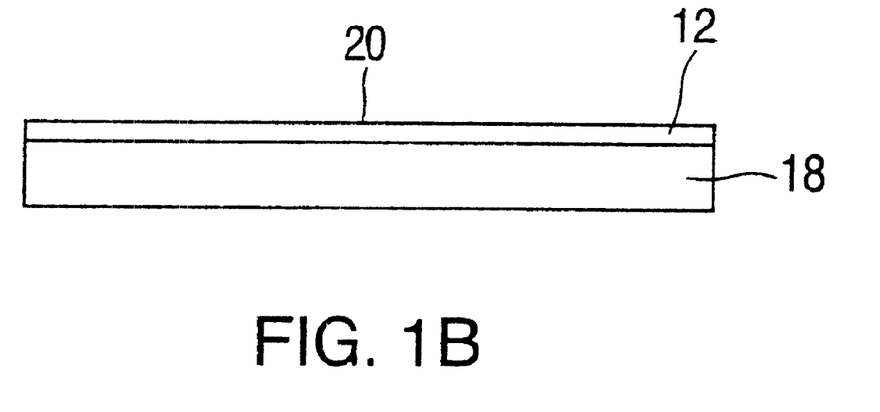

FIG. 1a shows a layout view of a portion of a semiconductor substrate with interconnection lines already formed generally at 10. Interconnection lines 12, 14, 16 have been formed on a substrate 18. The interconnections 12, 14, 16 and substrate 18 extend beyond the area shown in FIG. 1a, but have been limited for the purposes of clarity. The interconnection lines 12, 14, 16 can be formed in a substrate 18 which typically is a material such as silicon dioxide, silicon, low dielectric constant flowable or foam insulator material, or any other suitable semiconducting or insulator substrate, in which a trench has been formed and filled with a conductor such as copper to form the lines. The conductor used may be copper, aluminum, alloys of copper and aluminum, or any other suitable metal conductor. The surface of the substrate between the interconnections 12, 14, 16 will, in one embodiment, be coplanar with the top of the interconnections 12, 14, 16. FIG. 1b is cross section A—A' of FIG. 1a showing the top surface 20 of one interconnection 20, which is disposed on the substrate 18.

During the next step in fabrication, the exposed surfaces of the interconnections 12, 14, 16 and substrate 18 are covered with a layer of insulator. The insulator material can be any suitable flowable or low dielectric constant insulator, such as silicon dioxide. The insulator layer serves to electrically isolate the various interconnections 12, 14, 16 from each other and from subsequently applied layers of conductive components. A layer of resist is then formed on the layer of insulator, and then patterned to reveal the interconnection pattern of a second layer of interconnections in the resist.

The exposed areas of the insulator layer are then etched using conventional techniques, and the remaining resist removed.

Figure 2A:
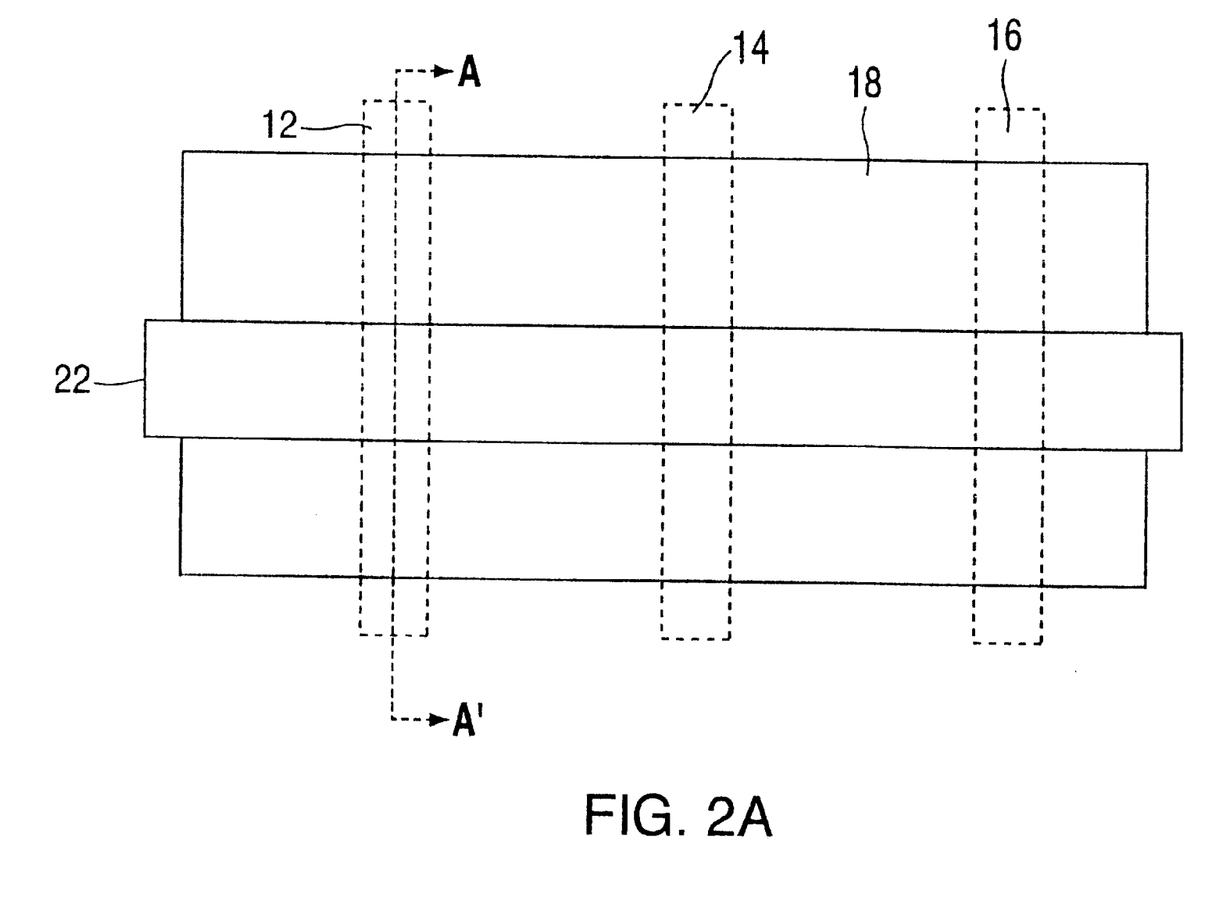
FIG. 2a is a layout view of the semiconductor substrate of FIG. 1a after an insulating layer and trench have been formed.
Figure 2B:
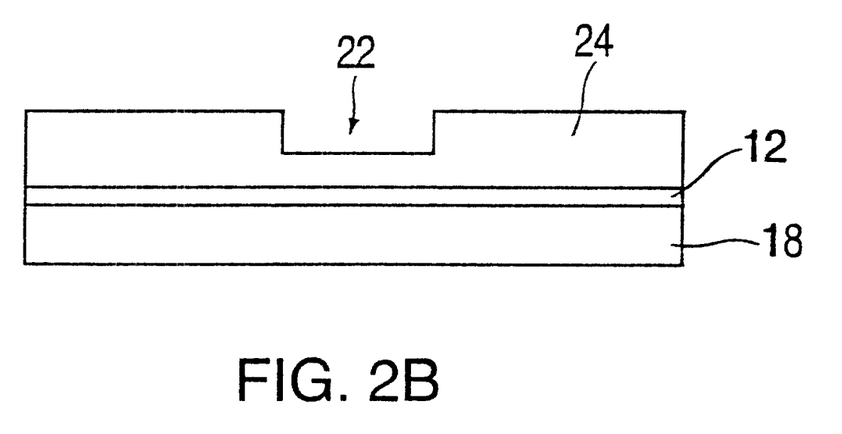

FIG. 2a, from which the insulator layer is omitted for clarity, is a layout view of the substrate 18, the interconnection 12, 14, 16 below the insulator layer (shown in dashed lines to represent their position below the insulator layer), and the trench 22 formed in the insulator layer. The trench 22 will extend beyond the length shown in FIG. 2a. FIG. 2b, which is cross section A—A' of FIG. 2a, shows the insulator layer 24 disposed on the interconnection 12. The trench 22 extends into the insulator layer 24 less than the full thickness of the insulator layer 24. Since the trench 22 does not extend fully through the insulator layer 24, the underlying interconnection lines 12, 14, 16 remain electrically insulated from each other and other components.

Figure 3A:
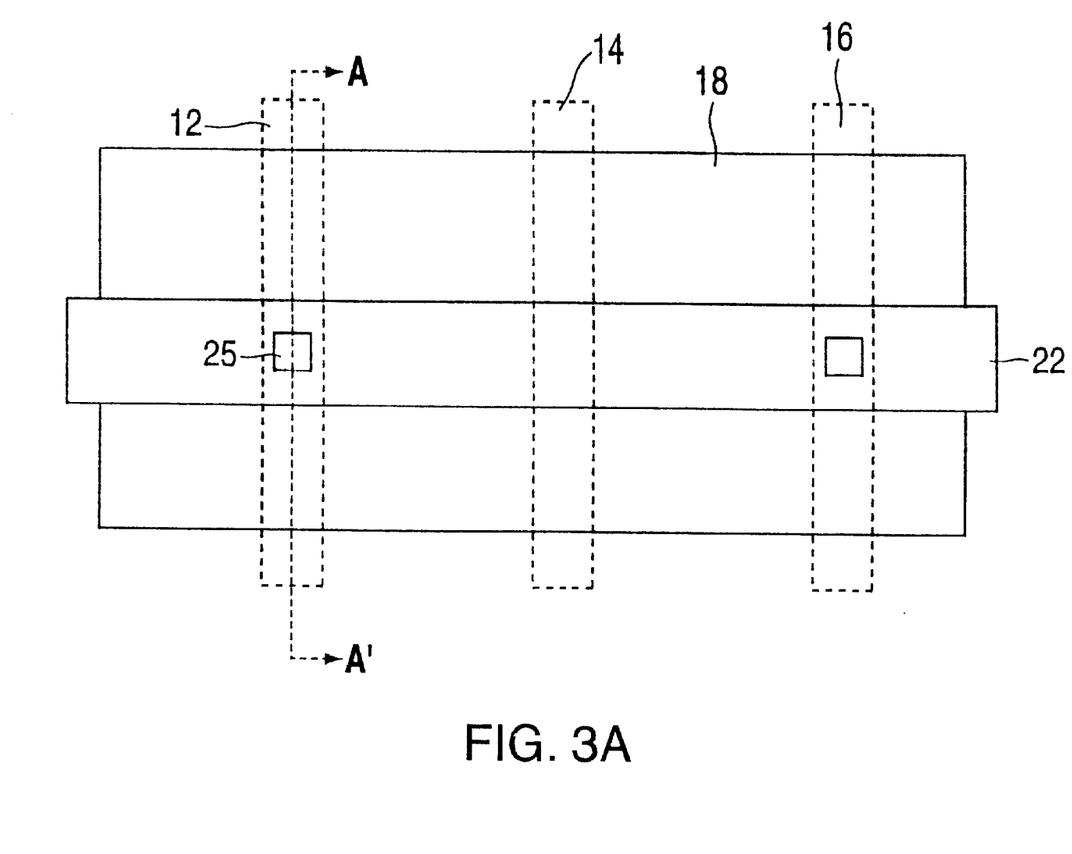
FIG. 3a is a layout view of the semiconductor substrate of FIG. 2a after formation of vias.
Figure 3B:
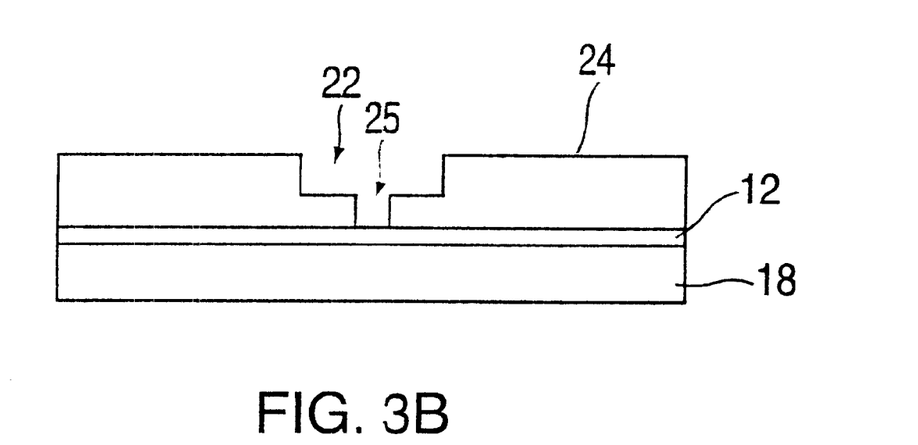

Fabrication continues with the formation of another layer of resist on the insulator layer 24. The resist is patterned to reveal openings within the trench 24. The portion of the insulator layer 24 within the trench 22 and underlying the openings are then etched through to the underlying interconnections 12, 14, 16 using conventional etch techniques. The resulting pattern is shown in FIG. 3a. In FIG. 3a, the patterned openings 25 are formed within the trench 22 directly over two of the underlying interconnection lines 12 and 16. FIG. 3b is cross section A—A' of FIG. 3a. As shown in FIG. 3b, the opening 25 extends through the insulator layer 24 to the underlying interconnection 12. In another embodiment, an etch stop layer can be formed on the underlying interconnections 12, 14, 16 and the substrate 18 prior to formation of the insulator layer 24. In this case, after the insulator layer 24 is etched through to the etch stop layer, a second etch is performed to remove the etch stop layer and reveal the underlying interconnection.

Figure 3C:
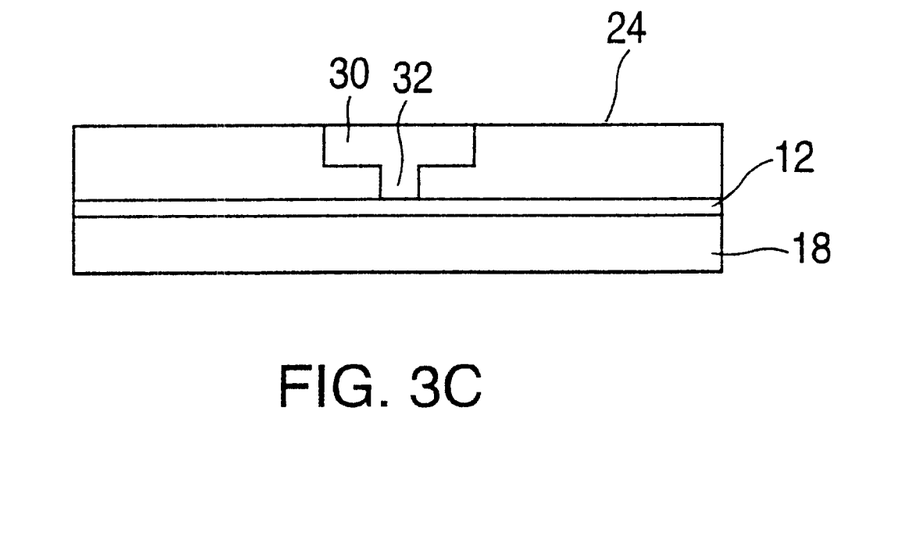
FIG. 3c is the substrate cross section of FIG. 3b after filling of the vias and trench.

In the next step of fabrication, the entire trench 22 and all of the openings 25 are simultaneously filled with a conductive material to form the top layer of interconnections and the vias. FIG. 3c represents FIG. 3b after filling of the trench 22 and openings 25. As shown in FIG. 3c, the completed via 32 electrically connects the top interconnection 30 with the underlying interconnection 12.

When forming the vias by the above process and similar processes, an important parameter is the size of the openings formed in the insulator layers. As increasing chip integration has reduced the feature size of chip components, vias have become smaller as well. Conventionally, vias are formed at minimum ground rule size, regardless of the proximity of adjacent components. To improve via reliability and capacity, vias are increased in size wherever possible according to the method of this invention.

Figure 4:
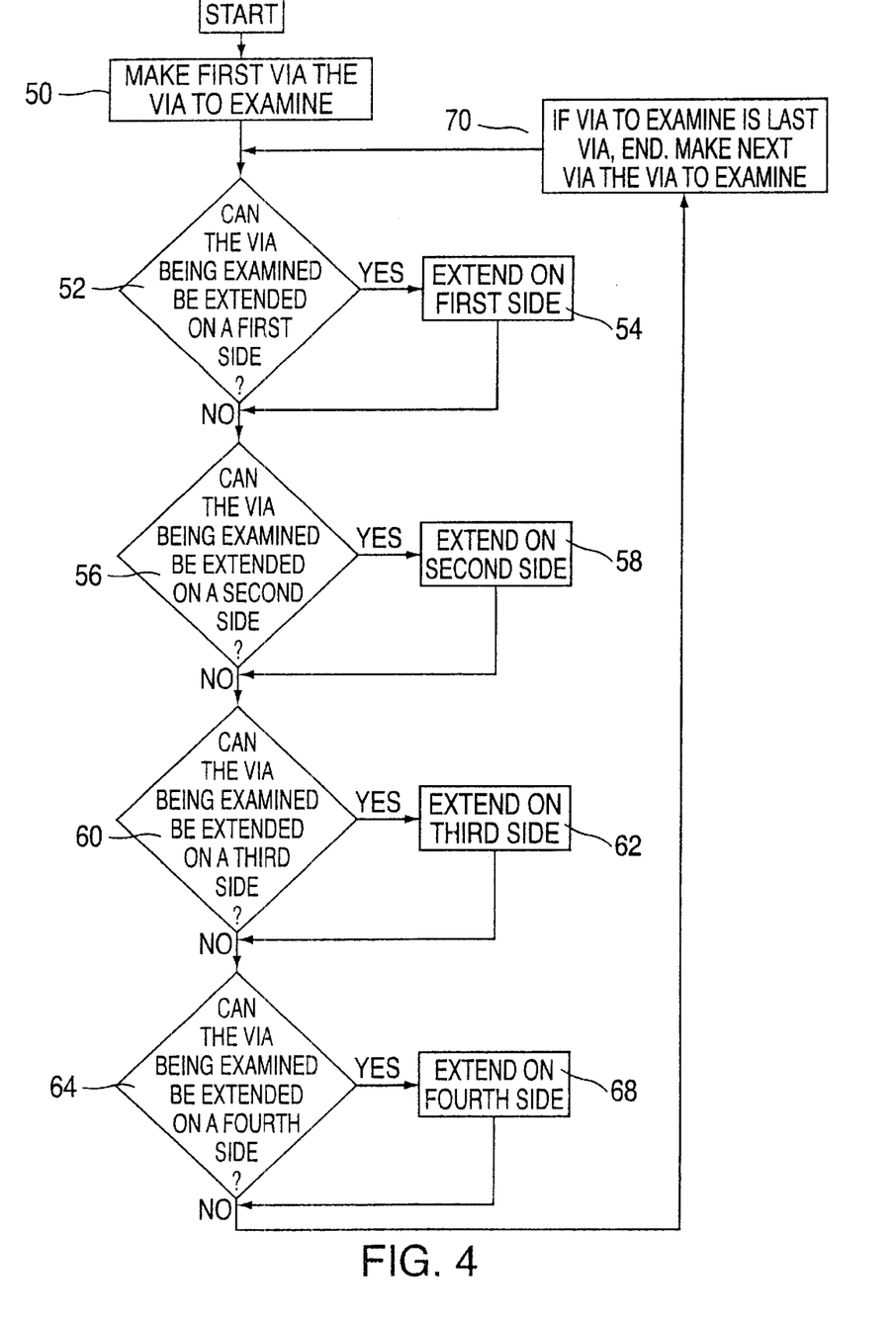
FIG. 4 is a flow chart showing one embodiment of the method for selectively determining via size; and, FIG. 5 is a layout view of exemplary vias with selective size increases.

FIG. 4 schematically represents one embodiment of the method of the present invention. FIG. 4 represents the process used to determine the lithographic size of each via opening prior to actual fabrication. At step 50, a via is chosen as the via to examine. Although any number of all of the vias on a single substrate can be examined for potential size increase, in a preferred embodiment all of the vias are checked. In step 52, the location of the via being examined relative to neighboring components on a single side is checked. Neighboring components that affect the possible size increase of the via include trenches, interconnection lines on other networks, and other vias, including vias located in the next highest or next lowest level. If in step 52 it is found that the via being examined can be expanded on a first side, then flow proceeds to step 54, where the via size is increased a predetermined amount (see below). If in step 52 it is found that the via being examined cannot be expanded on the first side, then flow proceeds to step 56.

In steps 56 through 68, the second, third, and fourth sides of the via a checked similarly to the first side. After the fourth side is checked, flow proceeds to step 70. In step 70, it is determined whether the via that was just examined was the final via. If the via was the final via, flow ends. If the via was not the final via, a new via is designated as the via to be examined, and flow returns to step 52. This process allows every via on a single substrate to be independently increased in four different directions. More or fewer directions can be incorporated if vias are formed in shapes other than rectangular, and via extension in any one direction can be the same or different than the other directions.

Figure 5:
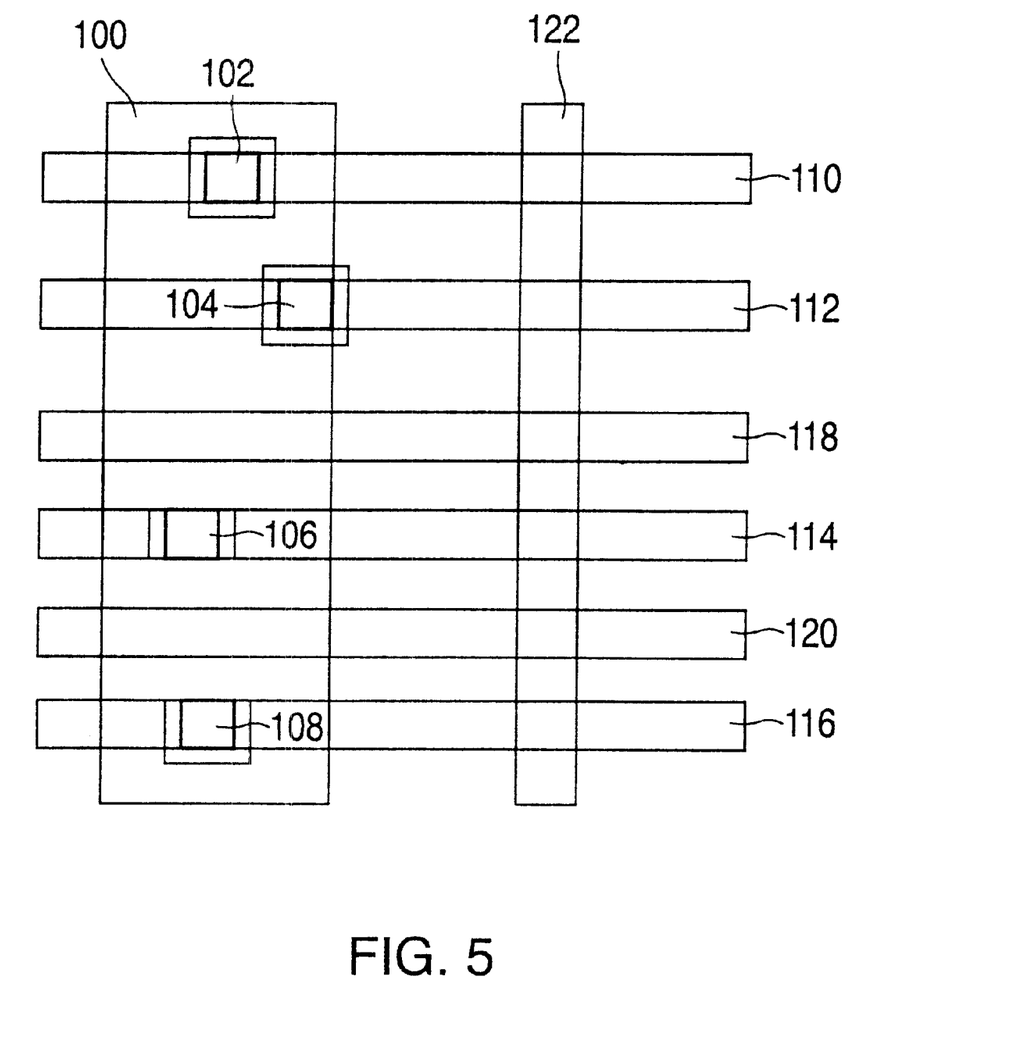

FIG. 5 shows one embodiment of the implementation of the above method of the present invention. A filled trench 100 is formed in an insulator layer (not shown) and has four vias 102, 104, 106, 108 connecting the filled trench 100 with the underlying interconnections 110, 112, 114, 116. Two other underlying interconnections 118, 120 are part of a different network, and as such cannot be within a ground-rule defined minimum distance (or ground-rule plus windage) from the filled trench 100 or the vias 102, 104, 106, 108. A second trench 122 is disposed adjacent the first trench 100.

In this embodiment, for example, the width of each via 102, 104, 106, 108 before extension of any side is generally less than $0.5\mu$ (micron), although any starting size via can be processed with the method of the present invention. Extension of any given side of a via by any extension length can be used, and different sides can be extended different lengths, as the application requires. Generally, extension length ranges from about 1 to 100 nm or larger.

Referring to FIG. 5, the original square shaped vias 102, 104, 106, 108 are represented by dark lines. The lighter lines around the dark lines of each via 102, 104, 106, 108 represent the size of the via after extension of one or more sides of the via. In this example, the first via 102 is located in the middle of the filled trench 100 (which is itself an interconnection) and at a great enough distance from the neighboring via 104 and interconnection 112 to allow for extension of 0.02 mm in all four directions.

The second via 104 is similarly positioned at a great enough distance from the neighboring interconnections 110, 118 and second filled trench 122 to allow for extension in all four directions. The second via 104 is allowed to extend past the edge of the filled trench 100.

The third via 106 is situated between two nearby interconnections 118, 120 on a different network within a minimum ground-rule dimension, and therefore cannot be extended toward either interconnection 118, 120. The third via 106 can, however, be extended the full 0.02 mm in both lateral directions, as shown in FIG. 5.

Finally, the fourth via 108 can be extended in all directions except for toward the nearby interconnection 120. As shown in FIG. 5, the fourth via 108 has been extended on three sides.

The process of selectively enlarging vias described above allows for the formation of vias with greater resistance to stress voiding or electromigration voiding than conventional vias. Since vias are selectively enlarged, shorting with other vias or networks is avoided.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the appended claims.

What is claimed is:

1. A method for selectively extending vias in a semiconductor device, comprising:
    a) determining if a first side of a first via can be extended;
    b) extending said first side if it was determined said first side could be extended; and,
    c) repeating steps a) and b) for the remaining sides of said first via.

2. The method of claim 1 wherein said first via has four sides.

3. The method of claim 1 wherein said first via is less than about $0.5\mu$ long by less than about $0.5\mu$ wide.

4. The method of claim 1 wherein said extending extends said first via on said first side or said remaining sides by about 1 to about 100 nm.

5. The method of claim 1 wherein said extending extends said first via on said first side or said remaining sides by different lengths.

6. The method of claim 1, further comprising
    d) repeating steps a) through c) for additional vias.

7. The method of claim 6, wherein said first via and said additional vias comprise all of the vias on a semiconductor device.

8. The method of claim 6 wherein said first via and said additional vias have four sides.

9. The method of claim 6 wherein said first via and said additional vias are less than about $0.5\mu$ long by less than about $0.5\mu$ wide.

10. The method of claim 6 wherein said extending extends said first via and said additional vias on said first side or said remaining sides by about 1 to about 100 nm.

11. The method of claim 6 wherein said extending extends said first via and said additional vias on said first side or said remaining sides by different lengths.

* * * * *